(12) United States Patent
Anderson et al.

(10) Patent No.: US 10,504,889 B1
(45) Date of Patent: Dec. 10, 2019

(54) INTEGRATING A JUNCTION FIELD EFFECT TRANSISTOR INTO A VERTICAL FIELD EFFECT TRANSISTOR

(71) Applicant: International Business Machines Corporation, Armonk, NY (US)

(72) Inventors: Brent A. Anderson, Jericho, VT (US); Huiming Bu, Glenmont, NY (US); Terence B. Hook, Jericho, VT (US); Xuefeng Liu, Schenectady, NY (US); Junli Wang, Albany, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/037,072

(22) Filed: Jul. 17, 2018

(51) Int. Cl.
| | |
|---|---|
| *H01L 27/06* | (2006.01) |
| *H01L 21/8234* | (2006.01) |
| *H01L 29/66* | (2006.01) |
| *H01L 29/423* | (2006.01) |
| *H01L 21/762* | (2006.01) |
| *H01L 29/78* | (2006.01) |
| *H01L 29/808* | (2006.01) |
| *H01L 29/10* | (2006.01) |
| *H01L 29/08* | (2006.01) |

(Continued)

(52) U.S. Cl.
CPC .... *H01L 27/0617* (2013.01); *H01L 21/76224* (2013.01); *H01L 21/823412* (2013.01); *H01L 21/823418* (2013.01); *H01L 21/823437* (2013.01); *H01L 21/823481* (2013.01); *H01L 21/823487* (2013.01); *H01L 29/0843* (2013.01); *H01L 29/0847* (2013.01); *H01L 29/1037* (2013.01); *H01L 29/1058* (2013.01); *H01L 29/42316* (2013.01); *H01L 29/42376* (2013.01); *H01L 29/6656* (2013.01); *H01L 29/66909* (2013.01); *H01L 29/7827* (2013.01); *H01L 29/8083* (2013.01); *H01L 21/0332* (2013.01); *H01L 21/0337* (2013.01); *H01L 21/31053* (2013.01); *H01L 29/045* (2013.01); *H01L 29/167* (2013.01); *H01L 29/36* (2013.01)

(58) Field of Classification Search
CPC ............................................. H01L 21/823487
See application file for complete search history.

(56) References Cited

U.S. PATENT DOCUMENTS

| | | |
|---|---|---|
| 5,889,298 A | 3/1999 | Plumton et al. |
| 6,163,052 A | 12/2000 | Liu et al. |

(Continued)

*Primary Examiner* — Yu-Hsi D Sun
(74) *Attorney, Agent, or Firm* — Cantor Colburn LLP; Vazken Alexanian

(57) ABSTRACT

Embodiments of the invention include first and second devices formed on a substrate. The first device includes a bottom source or drain (S/D) region, a plurality of fins formed on portions of the bottom S/D region, a bottom spacer formed on the bottom S/D region, a dielectric layer, a gate, a top S/D region formed on each fin of a plurality of fins, and one or more contacts. The dielectric layer is disposed between the gate and the fin of the plurality of fins. The second device includes a bottom doped region, a channel formed the bottom doped region, a sidewall doped region of the channel, a gate coupled to the sidewall doped region, a top doped region, and one or more contacts. A junction is formed between the channel and the sidewall doped region. The cap layer is formed on the gate and the top doped region.

10 Claims, 15 Drawing Sheets

(51) Int. Cl.
*H01L 21/3105* (2006.01)
*H01L 29/36* (2006.01)
*H01L 29/167* (2006.01)
*H01L 29/04* (2006.01)
*H01L 21/033* (2006.01)

(56) References Cited

U.S. PATENT DOCUMENTS

| | | |
|---|---|---|
| 6,861,303 B2 | 3/2005 | Hao et al. |
| 7,033,877 B2 | 4/2006 | Chaudhry et al. |
| 7,598,547 B2 | 10/2009 | Pendharker et al. |
| 7,772,056 B2 | 8/2010 | Miller et al. |
| 9,076,662 B2 | 7/2015 | El-Kareh et al. |
| 9,299,835 B1 | 3/2016 | Anderson et al. |
| 9,318,597 B2 | 4/2016 | Pala et al. |
| 2016/0035904 A1 | 2/2016 | Hisada et al. |
| 2019/0157161 A1* | 5/2019 | Balakrishnan ...... H01L 29/1066 |
| 2019/0172927 A1* | 6/2019 | Jagannathan ..... H01L 29/66553 |

* cited by examiner

INTEGRATING A JUNCTION FIELD EFFECT TRANSISTOR INTO A VERTICAL FIELD EFFECT TRANSISTOR

BACKGROUND

The present invention generally relates to semiconductor device and their fabrication. More specifically, the present invention relates to co-integrated fabrication processes and resulting structures for integrating a junction field effect transistors (JFETs) into a vertical field effect transistor (VFET) device architecture.

Field effect transistors (FETs) have been known for a number of years and are now the transistor of choice for use in complex integrated digital circuits. In general, FETs can be fabricated somewhat more simply and with larger process windows than bipolar junction transistors (BJTs) and, additionally, allow simplified circuit and device design. Constraints on transistor footprint size and current-carrying capacity are continually increasing to satisfy demands for higher digital switching performance, increased functionality and economy of manufacture.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as junction field effect transistors (JFETs) and VFETs can provide increased device density and increased performance over planar transistors. JFETs offer large conduction channel that can be used to control the flow of electric current. VFETs offer narrow channel lengths that offer low voltage and rapid response switching.

SUMMARY

Embodiments of the present invention are directed to a method of integrating a JFET into a VFET device architecture. A non-limiting example of the method includes forming a first transistor device and a second transistor device on a substrate, wherein forming the first transistor device includes forming one or more fins on the substrate, forming a bottom source or drain (S/D) region on the substrate, forming a bottom spacer on the bottom S/D region, forming a dielectric layer over the one or more fins, forming a metal gate for the one or more fins over the dielectric layer, forming a cap layer over the bottom spacer and metal gate, and forming a top S/D region over the one or more fins. The method also includes forming the second transistor device that includes forming a bottom region of the second transistor device on the substrate, forming the channel region on the bottom region, wherein the one or more fins of the first transistor device are formed with the channel region of the second transistor device, forming the bottom spacer, forming sidewalls of the channel region of the second transistor device, and forming a metal gate for the second transistor device, wherein the metal gate for the second transistor device is formed with the metal gate for the one or more fins, forming the cap layer over bottom spacer and the metal gate of the second transistor device, forming the top region over the sidewalls and the channel region, and forming one or more contacts over the top region.

Embodiments of the present invention are directed to a semiconductor device that integrates a JFET into a VFET device architecture. A non-limiting example of the semiconductor device includes a first semiconductor device and a second semiconductor device formed on a substrate, the first semiconductor device having a bottom source and drain region, a plurality of fins formed on one or more portions of the bottom source and drain region, a bottom spacer layer formed on the bottom source and drain region, a dielectric layer, a gate, wherein the dielectric layer is disposed between the gate and a fin of the plurality of fins, a cap layer formed on the bottom spacer layer and the gate, a top source and drain region formed on each fin of the plurality of fins, and one or more contacts. The semiconductor device includes the second semiconductor device having a bottom doped region, a channel formed on a portion of the bottom doped region, a sidewall doped region of the channel, wherein a junction is formed between the channel and the sidewall doped region, a gate coupled to the sidewall doped region, a top doped region, wherein the cap layer is formed on the gate and the top doped region, and one or more contacts.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-15 depict views of a section of a substrate/wafer after various fabrication operations on a semiconductor structure to form VFETs and JFETs according to embodiments of the invention, in which:

FIG. 1 depicts a cross-sectional view of the semiconductor structures after fabrication operations according to one or more embodiments of the invention;

FIG. 2 depicts a cross-sectional view of the semiconductor structures after fabrication operations according to one or more embodiments of the invention;

FIG. 3 depicts a cross-sectional view of the semiconductor structure after fabrication operations according to one or more embodiments of the invention;

FIG. 4 depicts a cross-sectional view of the semiconductor structure after fabrication operations according to one or more embodiments of the invention;

FIG. 5 depicts a cross-sectional view of the semiconductor structure after fabrication operations according to one or more embodiments of the invention;

FIG. 6 depicts a cross-sectional view of the semiconductor structure after fabrication operations according to one or more embodiments of the invention;

FIG. 7 depicts a cross-sectional view of the semiconductor structure after fabrication operations according to one or more embodiments of the invention;

FIG. 8 depicts a cross-sectional view of the semiconductor structure after fabrication operations according to one or more embodiments of the invention;

FIG. 9 depicts a cross-sectional view of the semiconductor structure after fabrication operations according to one or more embodiments of the invention;

FIG. 10 depicts a cross-sectional view of the semiconductor structure after fabrication operations according to one or more embodiments of the invention;

FIG. 11 depicts a cross-sectional view of the semiconductor structure after fabrication operations according to one or more embodiments of the invention;

FIG. 12 depicts a cross-sectional view of the semiconductor structure after fabrication operations according to one or more embodiments of the invention;

FIG. 13 depicts a cross-sectional view of the semiconductor structure after fabrication operations according to one or more embodiments of the invention;

FIG. 14 depicts a cross-sectional view of the semiconductor structure after fabrication operations according to one or more embodiments of the invention; and FIG. 15 depicts a top down view of the semiconductor structure after fabrication operations according to one or more embodiments of the invention.

Figure 1:
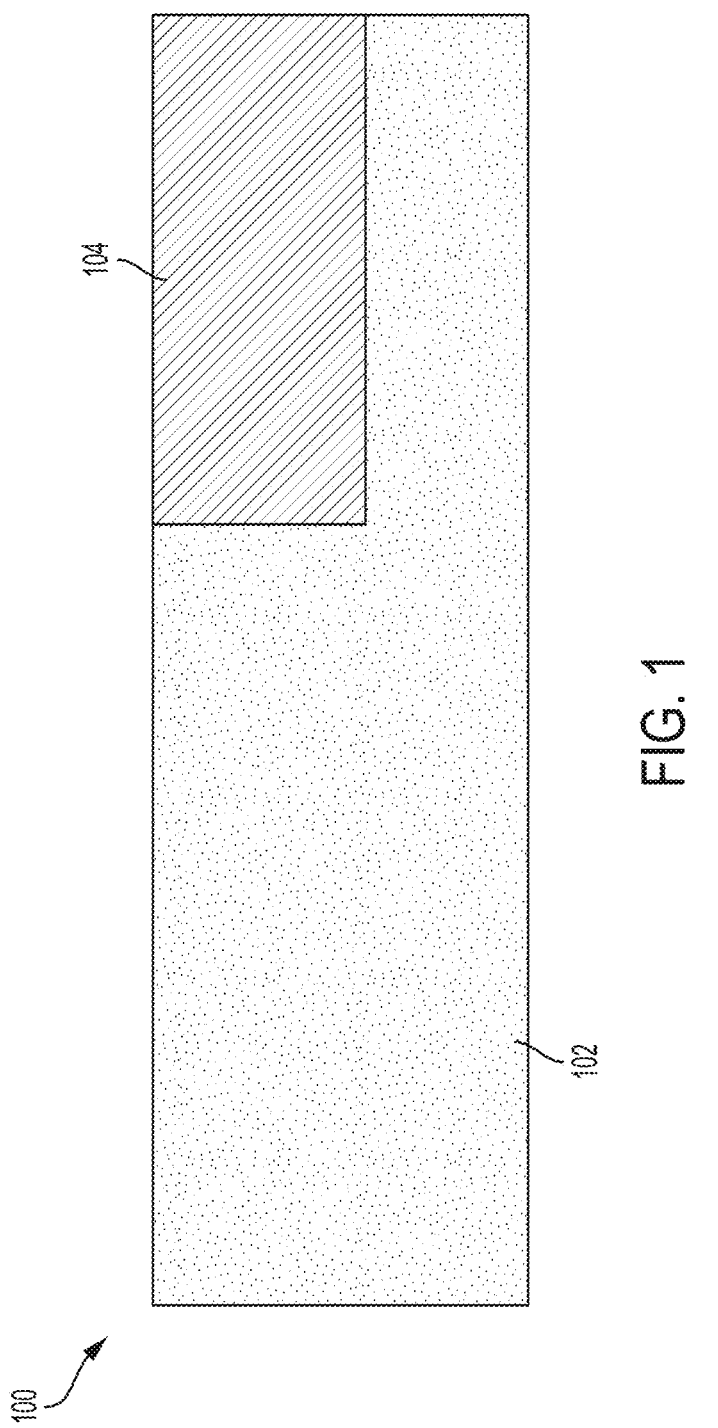

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although this invention includes a detailed description of VFET and JFET architectures, embodiments of the invention are not limited to the particular FET architectures or materials described in this specification. Rather, embodiments of the present invention are capable of being implemented in conjunction with any other type of FET architecture or materials now known or later developed.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

In recent years, there has been significant research and development with regard to nonplanar transistor architectures. Some non-planar transistor architectures, such as VFETs, employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

Decoupling the gate length from the gate pitch greatly improves the scaling of transistor density. With VFETs device scaling is determined by how closely conductive via contacts can be placed to source/drain and gate regions of the transistor. Unlike planar transistors, however, aggressive scaling of the VFET architecture has placed practical constraints on the maximum available width for the bottom source/drain (S/D) contact. Decreasing the width of the bottom S/D contact to satisfy progressively smaller VFET scaling factors has resulted in a gradual increase of the bottom S/D contact resistance, and consequently, to reductions in device performance.

The JFETs described herein include a relatively large conduction area for a high on-current and tight channel region control for a low off-current. Benefits associated with JFETs, in particular with JFETs having wrap around gates (described below) include an even larger conduction area for a high on-current and even tighter channel region control for a low off-current. These JFETs include a three-dimensional junction/fin where the gate is wrapped around the junction/fin of the JFET. However, there is a need in the art for improvements to these JFET structures in order to reduce the lateral dimensions and/or optimize source-to-channel linkup.

Turning now to an overview of the aspects of the invention, one or more embodiments of the invention address the above-described shortcomings of the prior art by providing fabrication operations and resulting structures for co-integrating a VFET and JFET on the same substrate. In embodiments of the invention, the VFET and JFET are designed to share certain fabrication operations for certain characteristics. For example, the processes to form the fins for the VFET and the channel region of the JFET, simultaneously. In embodiments of the invention, the thickness dimension of JFET channel region is greater than that of the fins for the VFET. Additionally, in embodiment of the invention, the gate region for the VFET and the JFET are formed simultaneously. The integration of the VFET and the JFET allow for a highly response, low voltage transistor device and for a high voltage, longer channel device to be formed on the same substrate.

FIGS. 1-15 depict views of a semiconductor structure 100 after various fabrication operation to form the VFET device and the JFET device on the same substrate 102 in accordance with one or more embodiments of the invention. FIG. 1 depicts a cross-sectional view of a structure 100 and respective processing steps in accordance with an aspect of the invention. The structure 100 includes a silicon substrate 102. In embodiments of the invention, the substrate 102 can be a semiconductor or an insulator with an active surface semiconductor layer. The substrate 102 can be crystalline, semi-crystalline, microcrystalline, or amorphous. The substrate 102 can be essentially (i.e., except for contaminants) a single element (e.g., silicon), primarily (i.e., with doping) of a single element, for example, silicon (Si) or germanium (Ge), or the substrate 102 can include a compound, for example, $Al_2O_3$, $SiO_2$, GaAs, SiC, or SiGe. The substrate 102 can also have multiple material layers, for example, a semiconductor-on-insulator substrate (e.g., SeOI), a silicon-on-insulator substrate (e.g., SOI), germanium-on-insulator substrate (e.g., GeOI), or silicon-germanium-on-insulator substrate (e.g., SGOI). The substrate 102 can also have other layers forming the substrate 102, including high-k oxides and/or nitrides. In one or more embodiments, the substrate 102 can be a silicon wafer. In an embodiment, the substrate 102 is a single crystal silicon wafer. An example, non-limiting thickness of substrate 102 is typically in the range of hundreds to thousands of micrometers. As shown in FIG. 1, the structure 100 includes a doped region 104 (bottom region) that is formed in the substrate 102. In one or more embodiments of the invention, the doped region 104 is formed by block level, ion implantation, or doped epitaxial growth.

The bottom regions 104 can be formed in the substrate by a variety of methods, such as, for example, in-situ doped epitaxy, doped following the epitaxy, or by implantation and plasma doping. In some embodiments of the present invention, the bottom region can be an n-type bottom region or a p-type bottom region. The bottom region 104 can be formed by any suitable process, including but not limited to, ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), and limited reaction processing CVD (LRPCVD). In some embodiments of the invention, the bottom region includes epitaxial semiconductor materials grown from gaseous or liquid precursors. In some embodiments of the invention, epitaxial regions are epitaxially grown over the substrate. Epitaxial semiconductor materials can be grown using vapor-phase epitaxy (VPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1 \times 10^{17}$ $cm^{-3}$ to $2 \times 10^{19}$ $cm^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions include silicon. In some embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent. Embodiments of the invention include forming a VFET over a first region and forming a JFET over a second region where the JFET region includes the bottom doped region.

Figure 2:
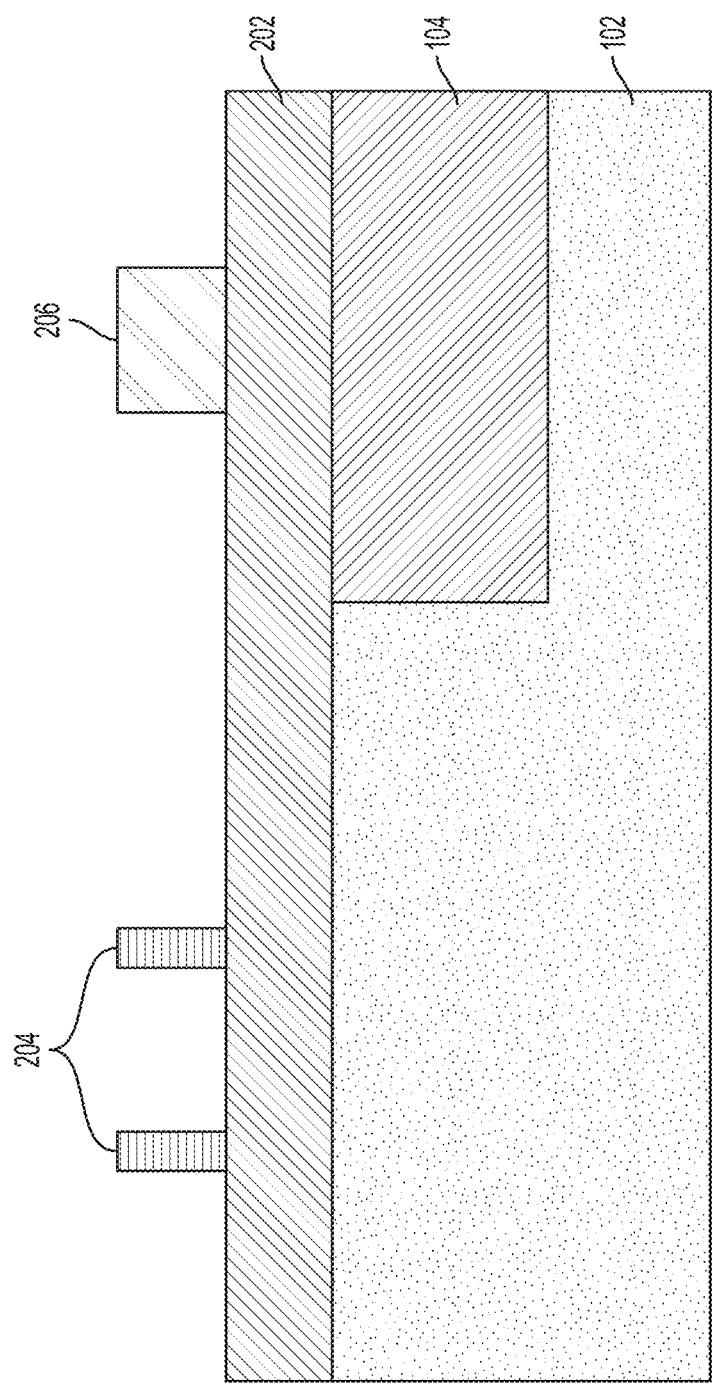

In FIG. 2, known semiconductor fabrication operations have been used to deposit a hard mask 202 onto the structure 100 shown in FIG. 1. In an example fabrication process, a patterned hard mask is deposited over the structure 100. The hard mask 202 includes any suitable hard mask material, such as, for example, a silicon nitride. The hard mask 202 can be formed utilizing a deposition process such as, for example, CVD, plasma enhanced chemical vapor deposition (PECVD), chemical solution deposition, or evaporation. In some embodiments of the invention, the hard mask 202 is formed by a thermal process such as, for example, oxidation or nitridation. The hard mask 202 can have a thickness of about 5 nm to 150 nm, for example, from 30 nm to 60 nm.

The vertical fins can be formed using self-aligned double patterning (SADP) spacer 204 is patterned on one or more portions of the hard mask 202, while JFET can be direct lithography using the pattern 206. In one or more embodiments of the invention, the SADP spacers 204 are patterned to form the vertical fins in the VFET region of the structure 100. In the JFET region of the structure 100, a direct lithography procedure is performed to form the JFET structure.

Figure 3:
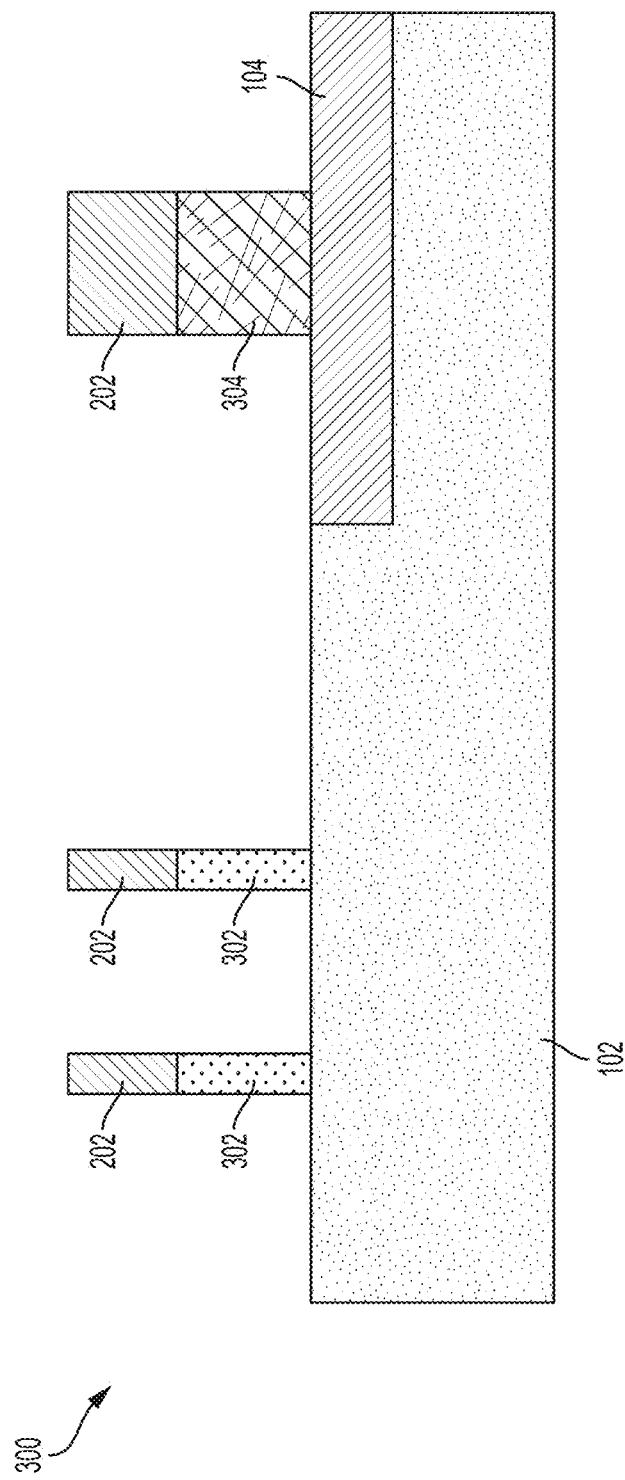
Figure 4:
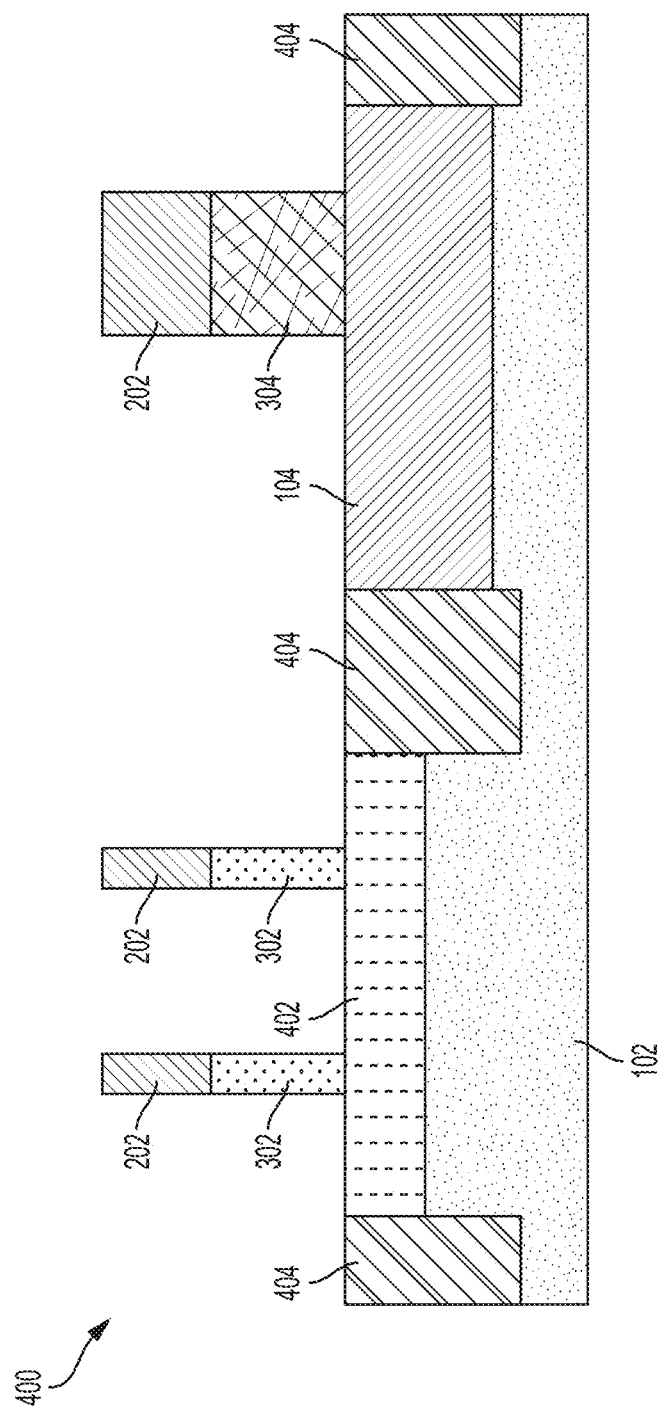

In FIG. 3, semiconductor fabrication operations have been used to form fins 302 and JFET channel region 304. In FIG. 4, known semiconductor fabrication operations have been used to form the bottom S/D region 402 in the VFET region. The bottom S/D region 402 can be formed by any known ion implantation or epitaxial growth technique.

In embodiments of the invention, transistor isolation can be provided by forming shallow trench isolation (STI) regions 404 between the VFET region and the JFET region. In embodiments of the invention, the STI regions 404 can be formed by depositing bulk dielectric material between the VFET region and the JFET region and recessing the bulk dielectric to the desired level. In addition, one or more spatial trench isolation regions 404 can be formed in the structure 100 to isolate the different devices formed on the substrate 102. In one or more embodiments of the invention, STI regions 404 is formed by etching trenches in the substrate 102 and then filling the trenches with, for example, silicon dioxide. Other suitable oxide materials can be deposited to form the STI regions 404. Non-limiting examples of suitable oxide materials for STI regions 404 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or a combination including at least one of the foregoing.

Figure 5:
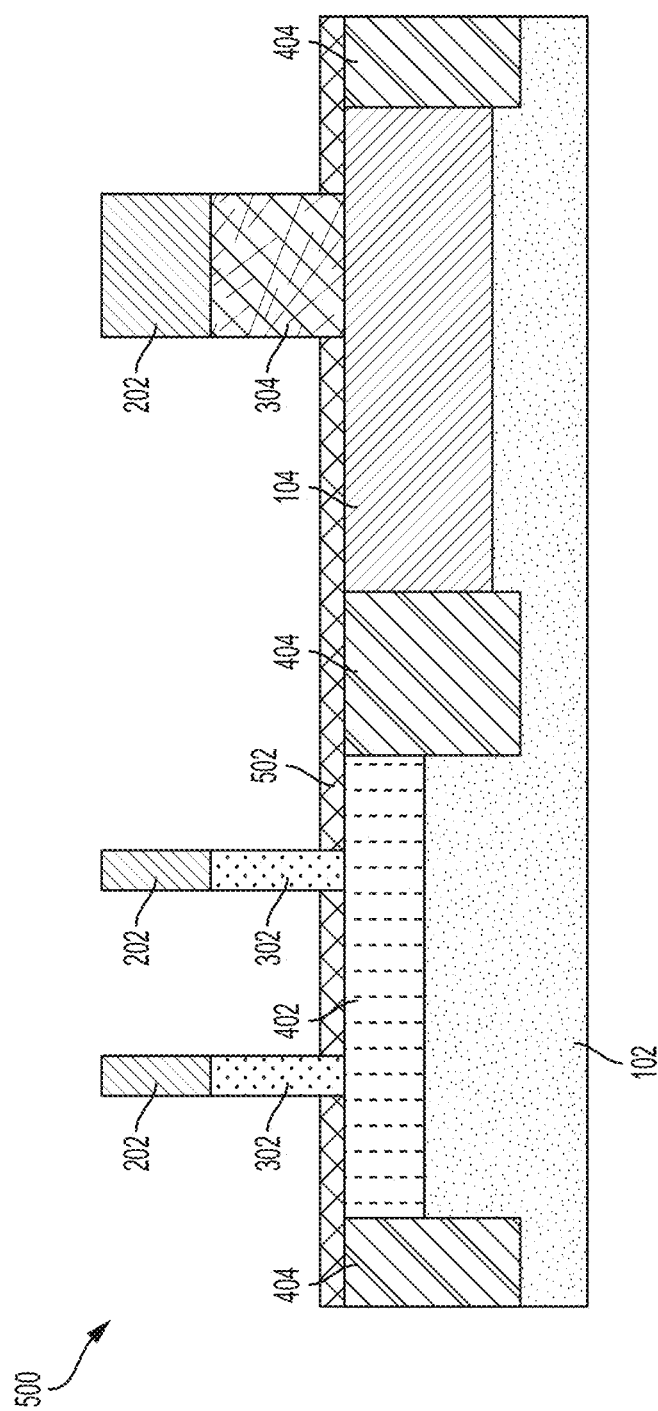

In FIG. 5, known semiconductor fabrication operations have been used to form a partially fabricated semiconductor structure for forming a bottom spacer 502 over portions of the VFET region and the JFET region. The bottom spacer 502 can include a dielectric material, such as silicon oxide, silicon nitride, silicon oxynitride, or a combination thereof, and can be formed using known deposition processes.

Figure 6:
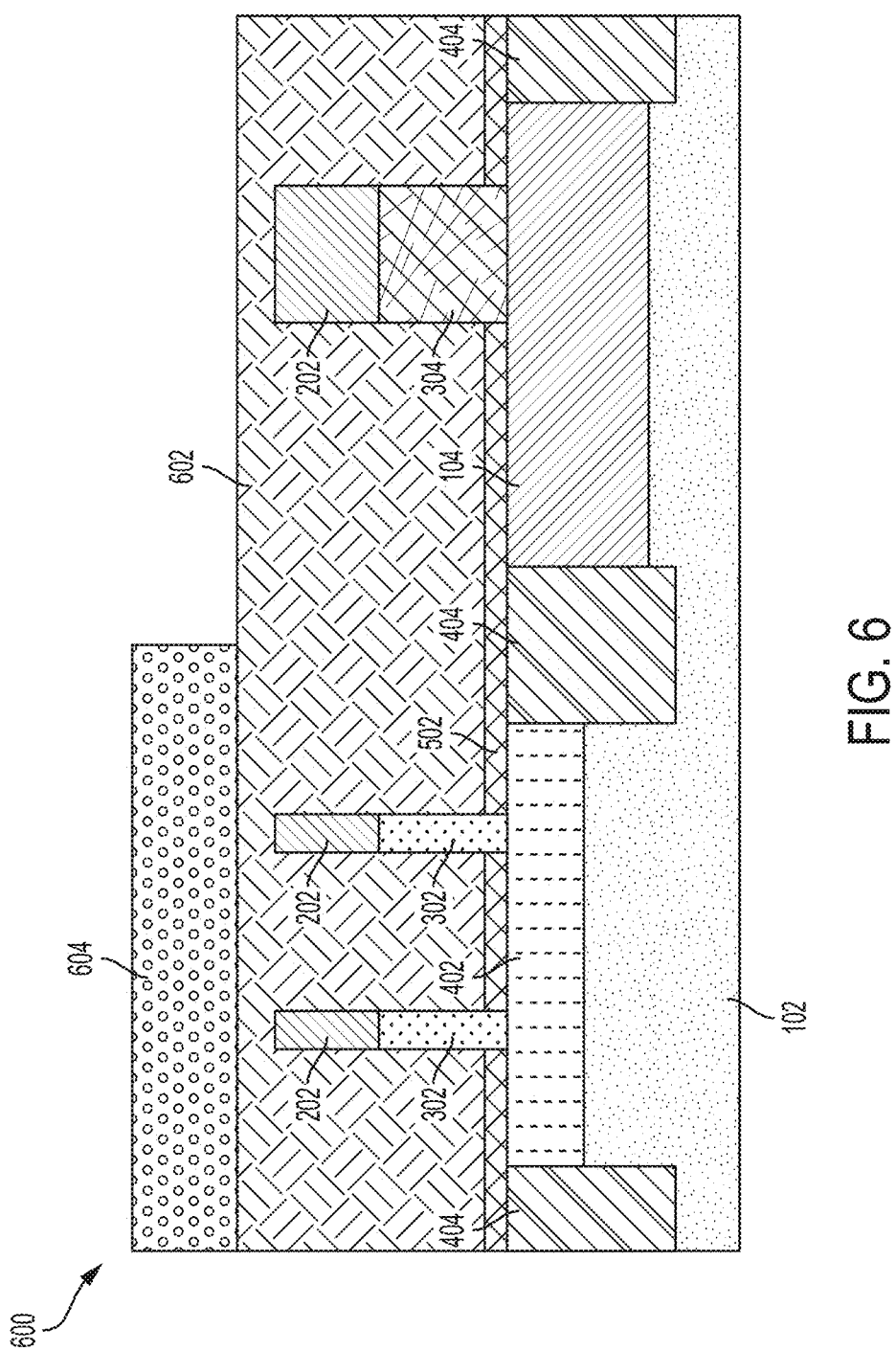

In FIG. 6, known semiconductor fabrication operations have been used to form an oxide layer 602 and a mask 604 over portions of the structure. In one or more embodiments of the invention, a mask 604 is formed over the VFET region of the deposited oxide layer 602 to expose portions of the JFET for etching.

Figure 7:
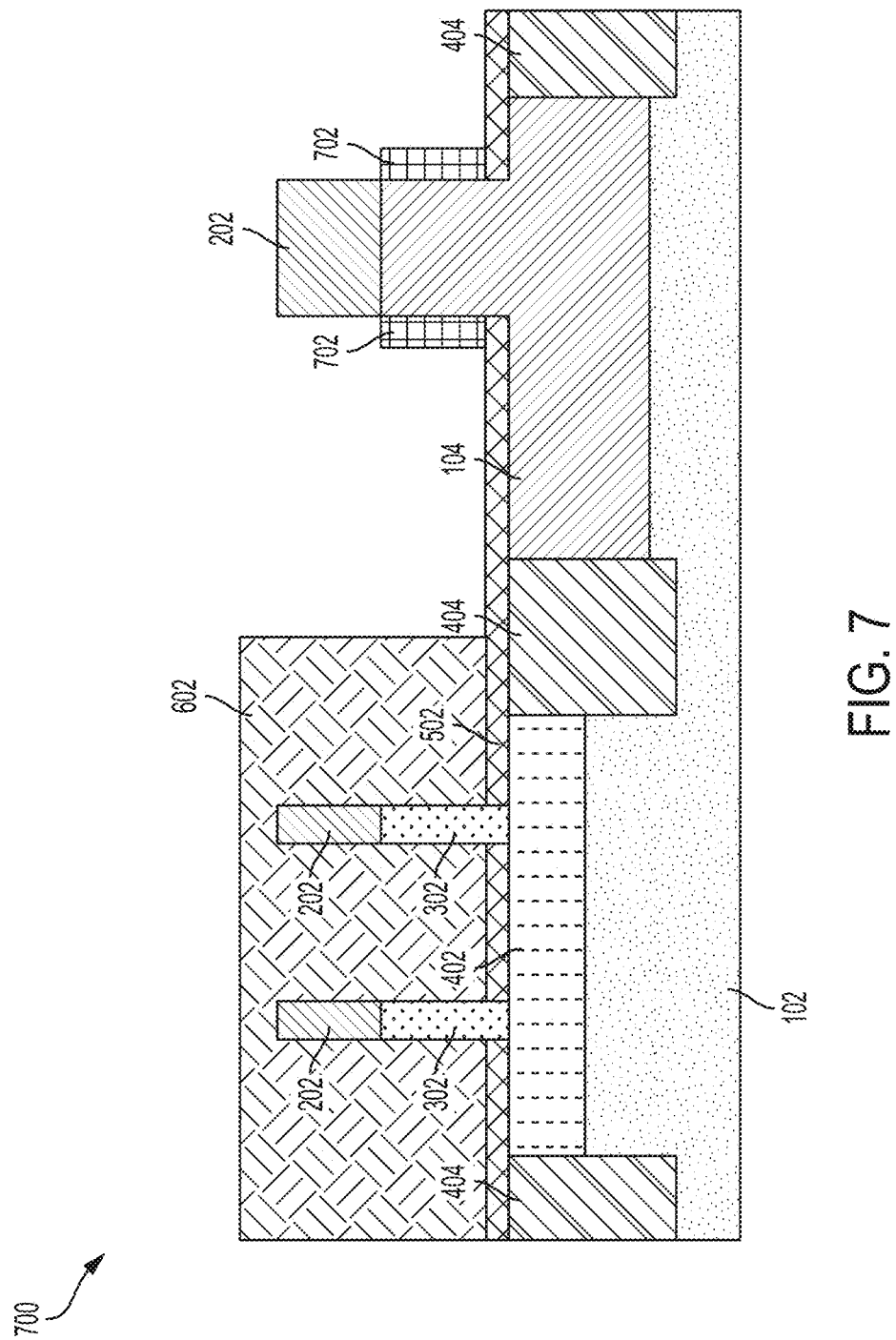

In FIG. 7, known semiconductor fabrication operations have been used to expose portions of the JFET region and form doped sidewall region 702. An etch (e.g., an RIE) or a recess is applied to remove the portions of the oxide layer 602 that are not covered by the patterned hard mask 604.

Subsequently, an in situ doped epitaxial growth is performed on one or more portions of the sidewalls of the JFET region to form the doped sidewall region 702. The doping can be occur during deposition (in-situ doped) by adding dopants, n-type dopants (e.g., phosphorus or arsenic) or p-type dopants (e.g., Ga, B, $BF_2$, or Al). The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

Figure 8:
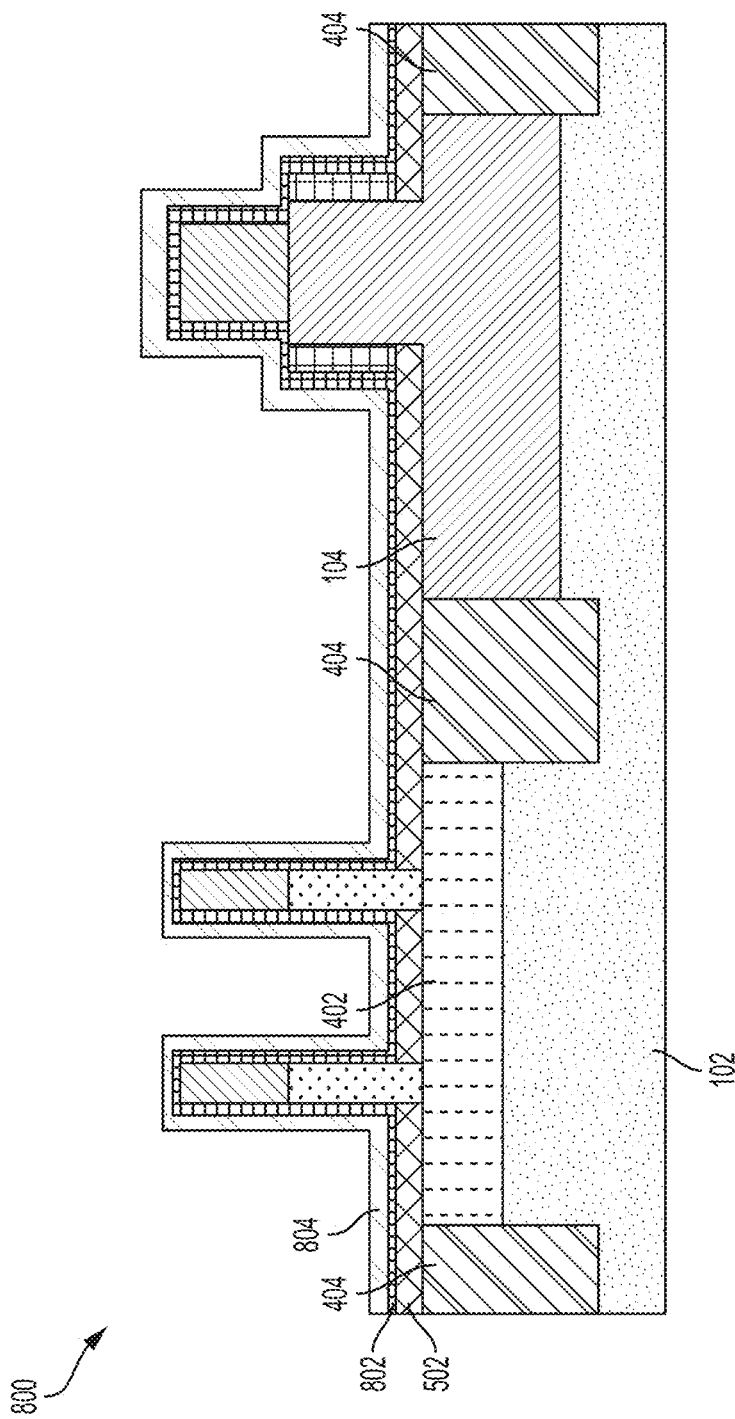
Figure 9:
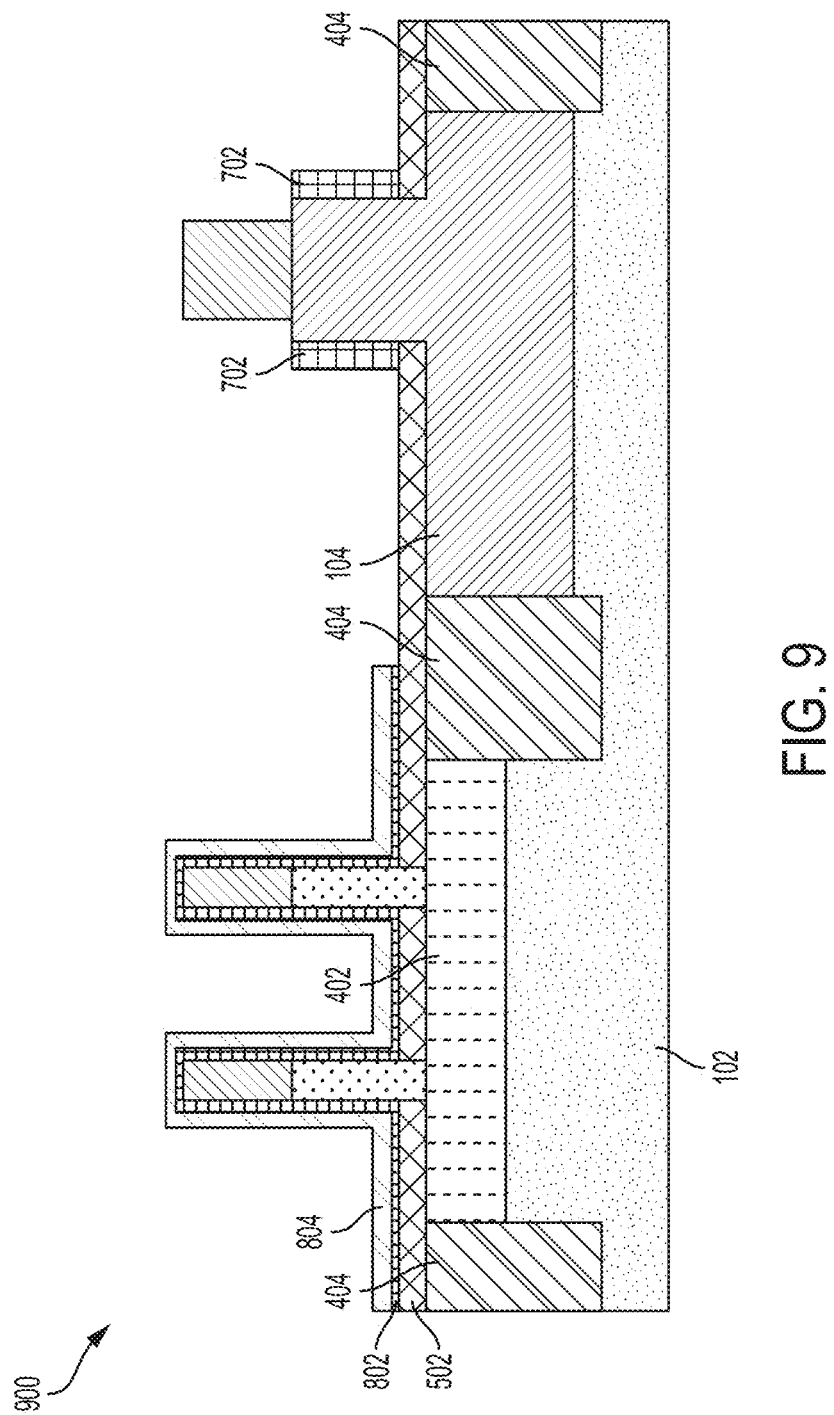
Figure 10:
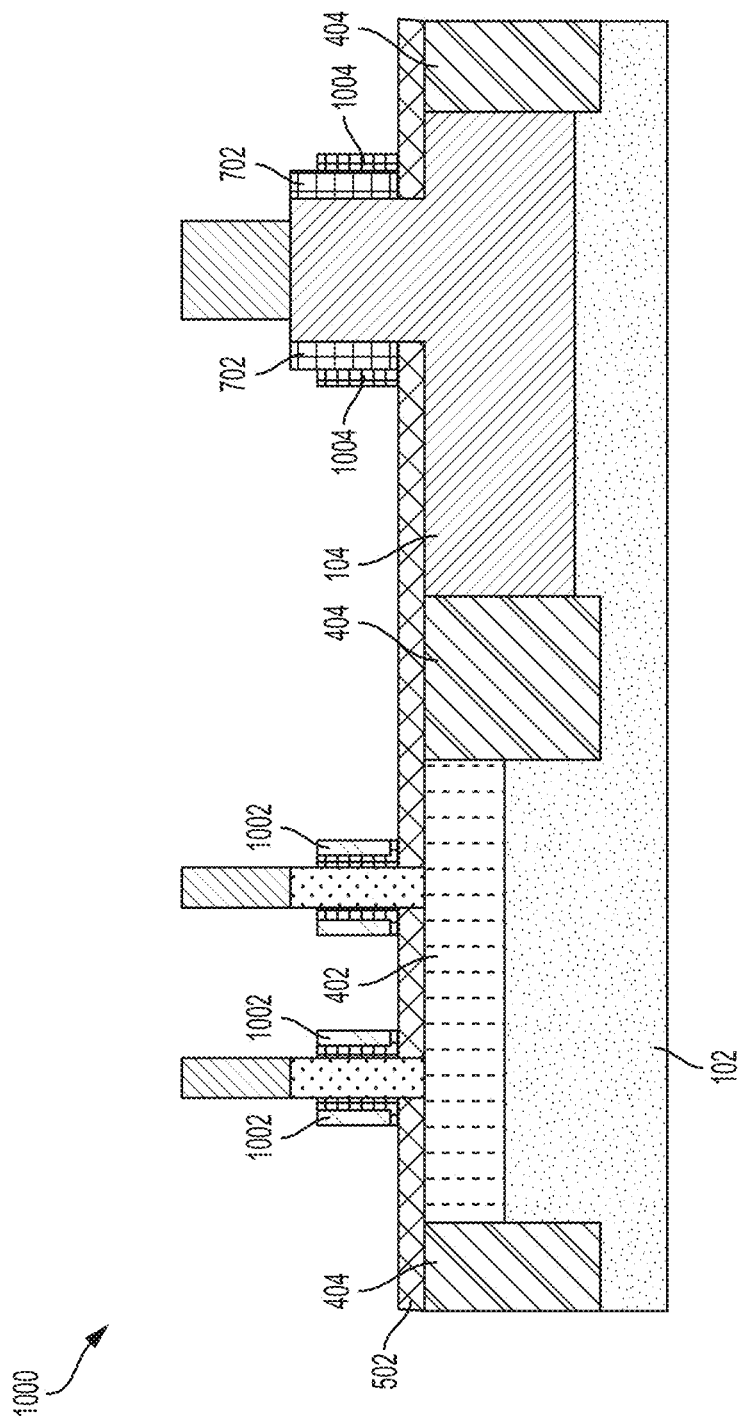

In FIG. 8, known semiconductor fabrication operations have been used to form a high k/TIN layer 802, 804, respectively. In one or more embodiments of the invention, the high k/TiN layers 802, 804 are conformally formed on the structure. In one or more embodiments of the invention, a typical k value of SiO2 is 3.9. "High-k" value materials refer to dielectric materials in which the k value is greater than that of SiO2 (3.9). For example, high-k materials include Al2O3, HfO2, ZrO2, TiO2, etc. In FIG. 9, known semiconductor fabrication operations have been used to expose the JFET region by removing portions of the high k/TiN layers 802, 804, respectively. A mask (not shown) can be used to protect the VFET region during an etch process to remove the exposed portions of the JFET region. In FIG. 10, known semiconductor fabrication operations have been used to form the metal layers 1002 (gate) of the VFET region and the metal layer 1004 (gate) of the JFET layer. In one or more embodiments of the invention the gates 1002 and 1004 are wrap-around gates. The remaining portions of the TiN layer 804 are removed from the structure and then the metal layer 1002 is deposited on the high k layer 802 of the VFET region and the metal layer 1004 is deposited adjacent to the doped sidewall region 702 of the JFET region.

Figure 11:
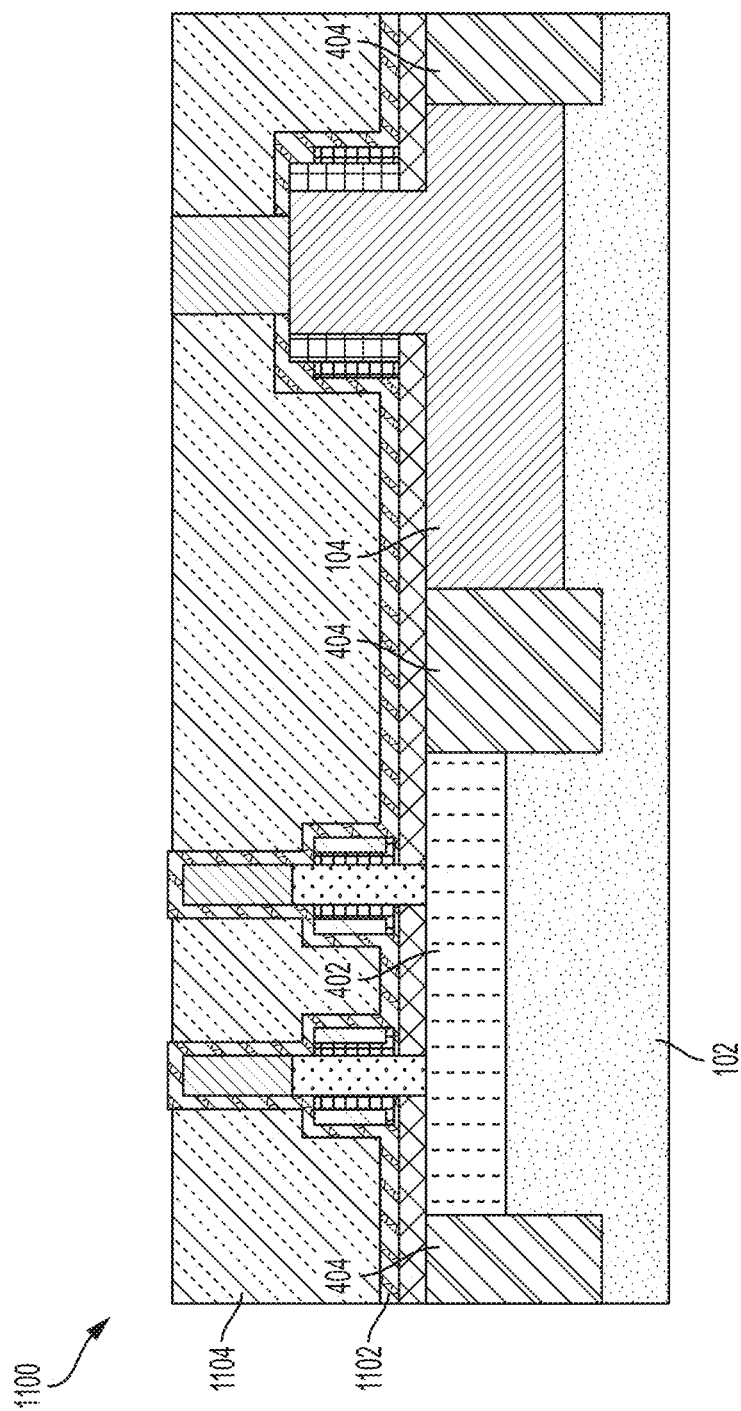

In FIG. 11, known semiconductor fabrication operations have been used to form a cap layer 1102. In one or more embodiments of the invention the cap layer 1102 is a SiN layer. It is to be understood the cap layer 1102 can be any suitable layer. In FIG. 11, known semiconductor fabrication operations have been used to form a protective interlayer dielectric (ILD) region 1104. The ILD region 1104 can be formed by depositing an oxide material in bulk (e.g., silicon dioxide) and polishing the bulk oxide back (e.g., using CMP) to the level of the spacers 1102 and the hard masks 202.

Figure 12:
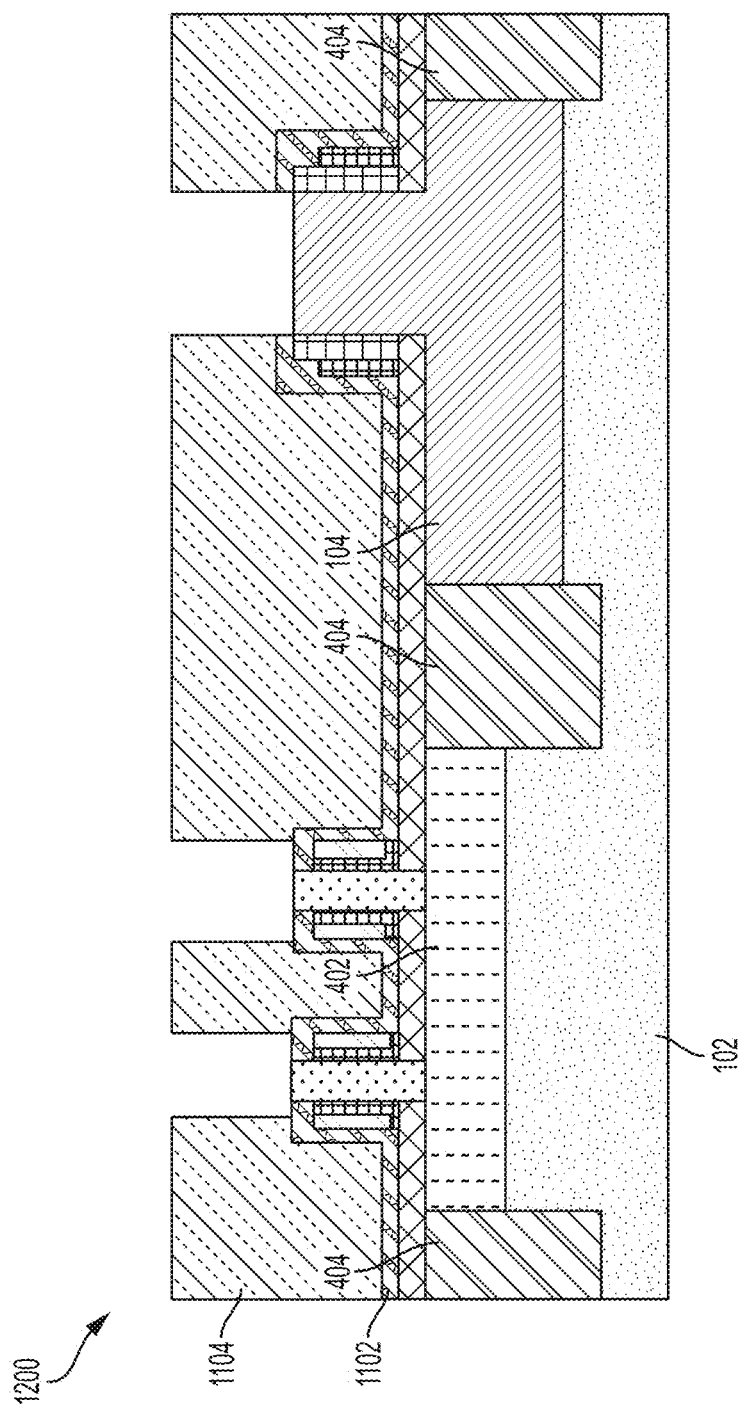
Figure 13:
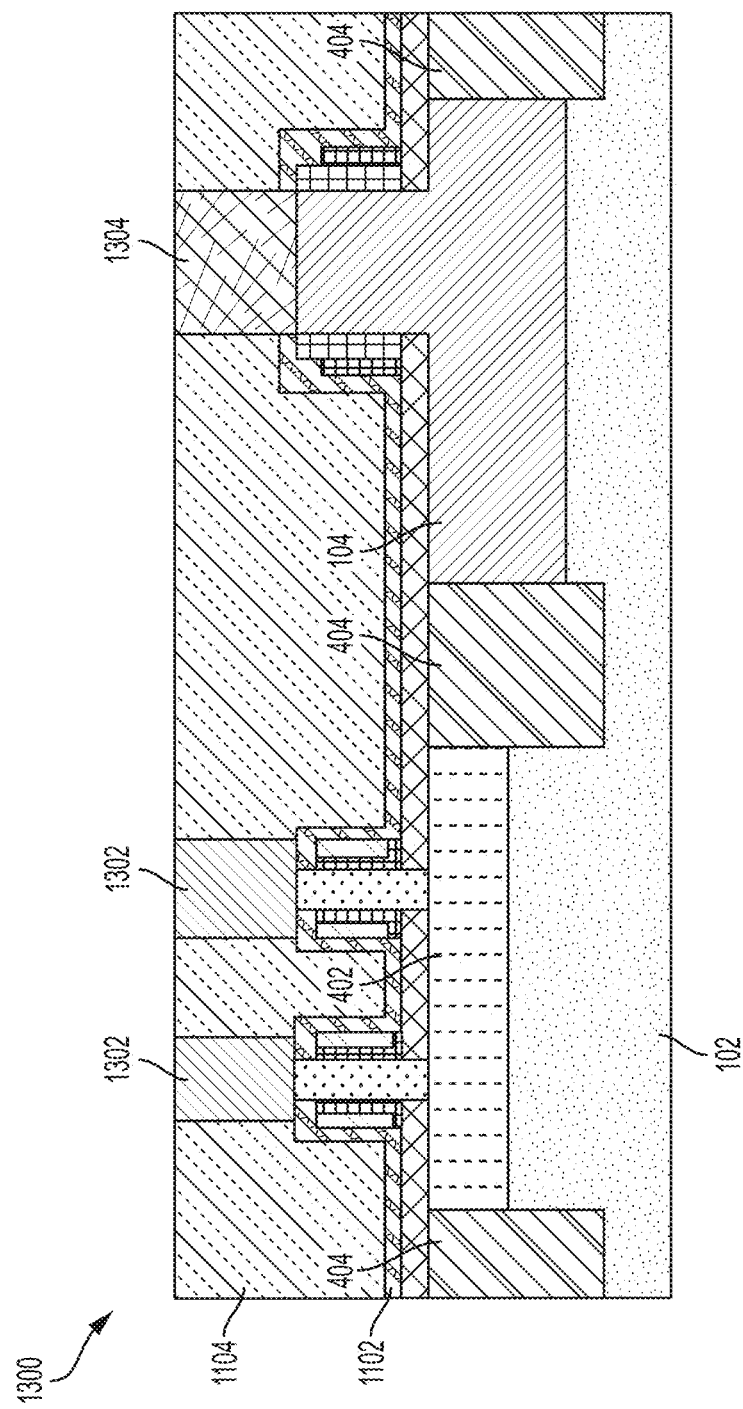

In FIG. 12, known semiconductor fabrication operations have been used to remove one or more portions of the ILD layer to form the top doped regions for the VFET region and the JFET region described below. In FIG. 13, known semiconductor fabrication operations have been used to form top doped SD regions 1302 over the VFET region and the top doped regions 1304 over the JFET regions. The top SD regions 1302 are formed on exposed portions of the fins 302. The top SD regions 1302 can each be an epitaxial layer epitaxially grown using known processes. In some embodiments of the present invention, the top SD regions 1302 is an n-type top SD or a p-type top S/D. In some embodiments of the present invention, the top SD regions 1302 is formed in a similar manner and composition as the bottom SD region 402. In some embodiments of the present invention, the top SD region 1302 is formed in a similar manner and composition as the bottom S/D region 108.

Figure 14:
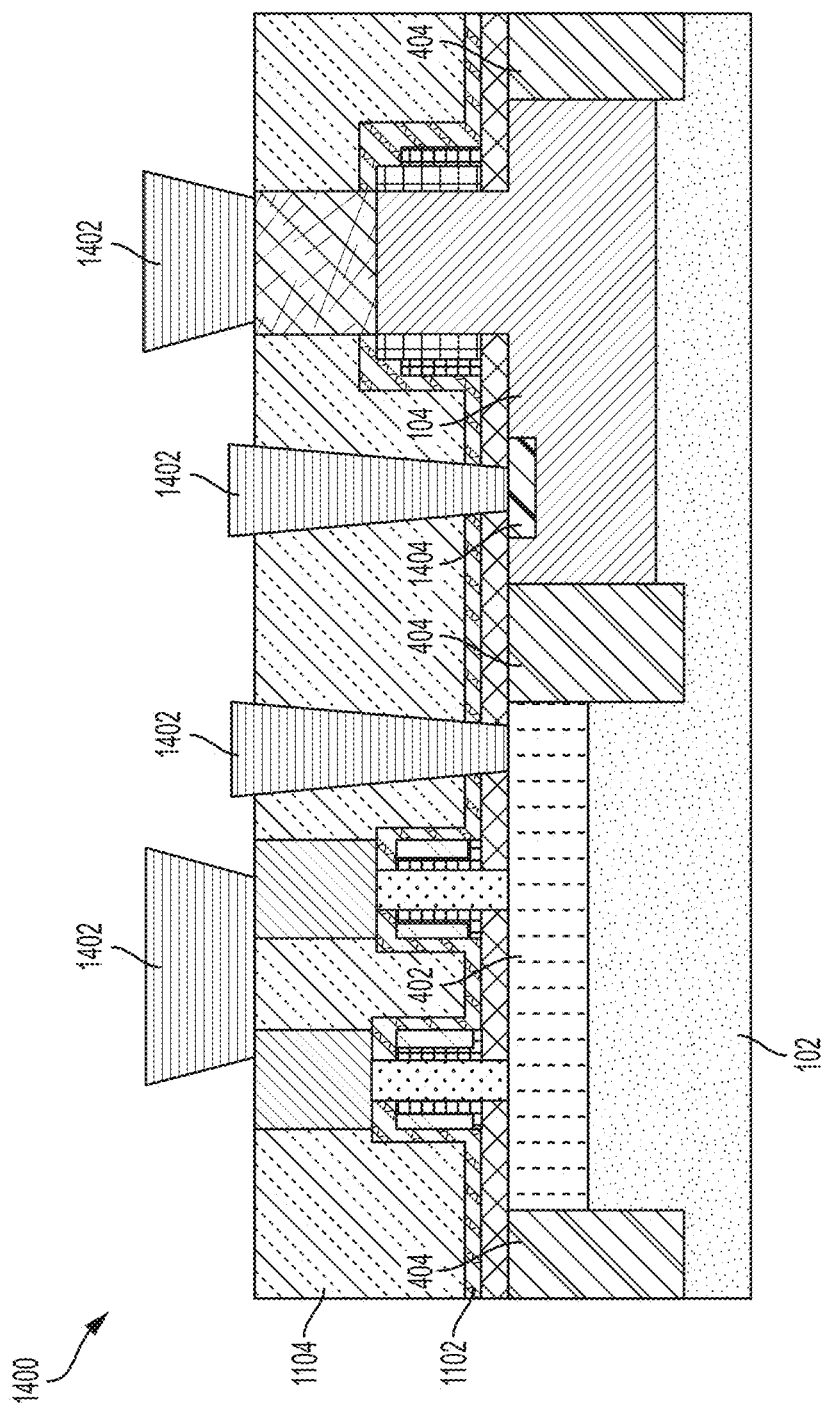
Figure 15:
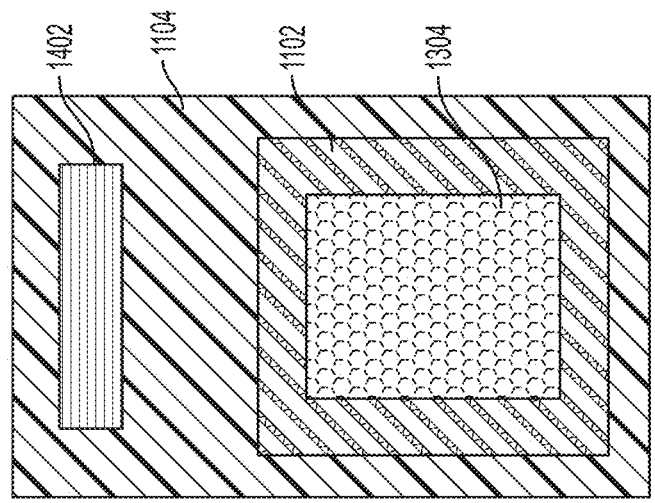
Figure 15:
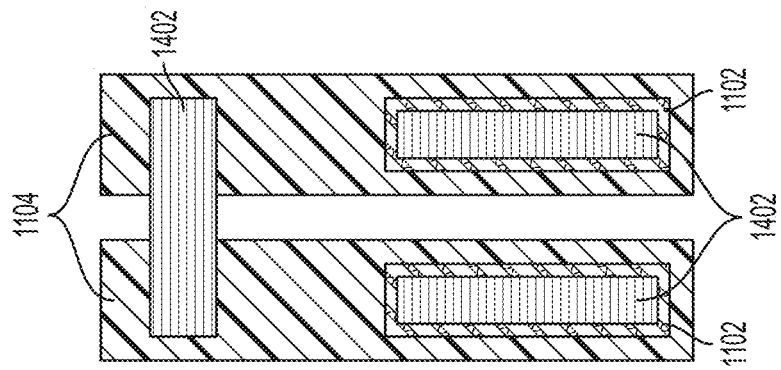

In FIG. 14, known semiconductor fabrication operations have been used to form contacts 1402 for the VFET and JFET regions. Contacts are formed as shown in FIG. 14. Patterning a mask and etching to form trenches. Subsequently, the trenches are filled with a metal to form the contacts. The top contacts 1402 can be formed using known metallization techniques. In one or more embodiments of the invention, the top contact 1402 is formed on a doped region 1404 having an increased dopant concentration compared to the doped region 104. In one or more embodiments of the invention, after etching the contact trench, an ion implantation process or a thin selective doped epitaxy process can be performed to increase the dopant concentration of the regions 1404. In other embodiments of the invention, a solid phase epitaxy (SPE) process can be used to increase the dopant concentration of the region 1404. The doped region 1404 can have a doping concentration between $5 \times 10^{19}$ $cm^{-3}$ and $1 \times 10^{21}$ $cm^3$. In some embodiments of the invention the thickness of the ILD 1104 is increased by depositing additional dielectric material prior to forming the top contacts 1402. The ILD 1104 can then be patterned into open trenches (not depicted) using known processes, such as a wet or dry etch. In some embodiments of the invention, the top contacts 1402 are overfilled into the trenches, forming overburdens above a surface of the ILD 1104. The overburden can then be planarized using, for example, CMP.

The top contacts 1402 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the top contacts 1402 include tungsten and a metal liner such as a Ti/TiN liner. The metal liner is a barrier that prevents metal in the top contacts 1402 from diffusing into, or doping, the surrounding materials, which can degrade their properties. Silicon, for example, forms deep-level traps when doped with copper. An ideal barrier metal liner must limit metal diffusivity sufficiently to chemically isolate the conductor from the surrounding materials and should have a high electrical conductivity, for example, tantalum nitride and tantalum (TaN/Ta), titanium, titanium nitride, cobalt, ruthenium, and manganese In FIG. 15, a top view of the structure 1500 of the VFET and the JFET in accordance with one or more embodiments of the invention is shown. The top view of the structure 1500 shows the gates 1402 for the VFET and the JFET that were formed on the ILD 1104. In addition, the top SD region 1402 and cap layer 1102 for the VFET are shown. Also, the top region 1304 and the cap layer 1102 for the JFET region are shown.

The technical benefits and effects include integrating two devices having different characteristics are formed integrally. Also resources are conserved and the density of devices on an integrated circuit is increased by integrating multiple devices on the same substrate. In addition a vertical JFET is implemented offering a larger conduction path with tighter channel controls. Typical JFETs pinch off from top to bottom where the vertical JFET pinches off from side to middle of the vertical stud. Traditional JFET also do not provide wrap around p+ regions around the n+ FIN/channel. Also, the technical benefits and effects provide an extended contact (laterally) that allows for the use of a higher voltage drop from the drain, similar to a lateral drifted FET, without interfering with the function of the device. The extended drain contact allows for higher voltages to be used for a wide range of voltage modulations. The elevated voltage is dropped at the drift region, which is defined by doping of 404 combined with a varied drift region length, which is in the range of few 10s nm to few um, to provide a device capable of handling I/O or analog device applications.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating semiconductor devices, the method comprising:
    performing fabrication operations to form a first transistor device on a substrate, wherein the fabrication operations to form the first transistor device comprise:
        forming one or more fins on the substrate;
        forming a bottom source or drain (S/D) region on the substrate;
        forming a bottom spacer on the bottom S/D region;
        forming a dielectric layer over the one or more fins;

forming a metal gate for the one or more fins over the dielectric layer;

forming a cap layer over the bottom spacer and metal gate; and forming a top S/D region over the one or more fins; and performing fabrication operations to form a second transistor device on the substrate, wherein the fabrication operations to form the second transistor device comprise:

forming a bottom region of the second transistor device on the substrate;

forming the channel region on the bottom region, wherein the one or more fins of the first transistor device are formed with the channel region of the second transistor device;

forming the bottom spacer;

forming sidewalls of the channel region of the second transistor device;

forming a metal gate for the second transistor device, wherein the metal gate for the second transistor device is formed with the metal gate for the one or more fins;

forming the cap layer over bottom spacer and the metal gate of the second transistor device;

forming the top region over the sidewalls and the channel region; and forming one or more contacts over the top region.

2. The method of claim 1, wherein the first transistor device comprises a vertical fin field effect transistor (VFET) and the second transistor device comprises a junction field effect transistor (JEFT).

3. The method of claim 1, wherein the gate of the first semiconductor device and the second semiconductor device is a wrap-around gate.

4. The method of claim 1, wherein the dielectric layer comprises a high-k dielectric layer.

5. The method of claim 1, wherein there is no high-k dielectric layer on the JFET gate.

6. The method of claim 1, wherein a width dimension of the channel region is greater that a width dimension of each of the one or more fins.

7. The method of claim 1, wherein forming the one or more fins comprises a self-aligned double patterning (SADP) process.

8. The method of claim 1, wherein forming the channel region of the second transistor comprises a direct lithography process.

9. The method of claim 1 further comprising forming one or more shallow trench isolation layers between the first transistor device and the second transistor device.

10. The method of claim 1, wherein:

the channel comprises sidewalls and a main body region; and the sidewalls of the channel comprise a different type of material than the main body region of the channel.

* * * * *